United States Patent
Chou et al.

(10) Patent No.: US 10,884,073 B2
(45) Date of Patent: Jan. 5, 2021

(54) DETECTION OF CABLE CONNECTIONS

(71) Applicant: Hewlett-Packard Development Company, L.P., Spring, TX (US)

(72) Inventors: Dee Chou, Boise, ID (US); Adrian Rothenbuhler, Boise, ID (US); Eric Young, Boise, ID (US); Tiffany L Greyson, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 83 days.

(21) Appl. No.: 16/329,877

(22) PCT Filed: Sep. 9, 2016

(86) PCT No.: PCT/US2016/051102
§ 371 (c)(1),
(2) Date: Mar. 1, 2019

(87) PCT Pub. No.: WO2018/048429
PCT Pub. Date: Mar. 15, 2018

(65) Prior Publication Data
US 2019/0195934 A1    Jun. 27, 2019

(51) Int. Cl.
*G01R 31/67* (2020.01)
*B41J 2/045* (2006.01)

(52) U.S. Cl.
CPC ........... *G01R 31/67* (2020.01); *B41J 2/04548* (2013.01)

(58) Field of Classification Search
CPC ............................. G01R 31/67; B41J 2/04548
USPC .......................................... 324/66, 67, 71.1
See application file for complete search history.

(56) References Cited

U.S. PATENT DOCUMENTS

| | | | |
|---|---|---|---|
| 3,858,159 A * | 12/1974 | Worth | H01R 12/675 439/399 |
| 5,323,393 A | 6/1994 | Barrett et al. | |
| 5,442,305 A | 8/1995 | Martin et al. | |
| 6,392,317 B1 * | 5/2002 | Hall | E21B 17/003 174/47 |
| 6,459,268 B1 * | 10/2002 | Lutz | G01R 31/3278 324/418 |
| 8,325,236 B2 | 12/2012 | Hallberg | |
| 8,549,190 B2 | 10/2013 | Komano et al. | |
| 8,725,910 B1 | 5/2014 | Sala et al. | |
| 2003/0110412 A1 | 6/2003 | Neville | |

(Continued)

OTHER PUBLICATIONS

Xerox ~ About Phaser SMART, < http://www.phasersmart.com/overview.htm > ~ Aug. 15, 2016 ~ 1 page.

*Primary Examiner* — Giovanni Astacio-Oquendo
(74) *Attorney, Agent, or Firm* — HP Inc. Patent Department

(57) ABSTRACT

An example device includes a physical interface to connect to a system. The device also includes a power source to deliver power to a diagnostic portion of the system via the physical interface. The diagnostic portion draws a small amount of power. The power source delivers the power based on the system not receiving power from an internal source. The device also includes a reporting engine to communicatively couple to the system via the physical interface. The reporting engine retrieves an indication of whether a cable in the system is connected.

14 Claims, 7 Drawing Sheets

(56) References Cited

U.S. PATENT DOCUMENTS

| | | | |
|---|---|---|---|
| 2004/0017203 A1* | 1/2004 | Becker | G01R 31/74 324/507 |
| 2006/0178047 A1* | 8/2006 | Croan | H01R 24/40 439/578 |
| 2008/0299819 A1 | 12/2008 | Kakutani | |
| 2010/0176830 A1* | 7/2010 | Watson | G01R 31/3278 324/756.05 |
| 2014/0149630 A1 | 5/2014 | Burr et al. | |
| 2016/0192115 A1 | 6/2016 | Weiss | |

* cited by examiner

DETECTION OF CABLE CONNECTIONS

BACKGROUND

A printer may include an interface to receive data representative of content to be printed or a medium on which to print the content. The printer may also include a formatter. The formatter may process the data representative of the content to convert the data to a form that can be readily printed. The form may depend on which type of printer it is. The printer may be a laser printer, an inkjet printer, or the like. A laser printer may produce an amplitude modulation halftone image for each color to be printed. An inkjet printer may produce a pattern of dots based on a frequency modulation halftone scheme for each color to be printed.

DETAILED DESCRIPTION

The formatter may communicate the converted data to a controller. The controller may be communicatively coupled to a plurality of image forming or media control components. The controller may instruct the components as to which actions should be taken to produce the content on the medium. The various components of the printer, such as the interface to receive the data, the formatter, the controller, the plurality of image forming or media control components, a power supply, or the like, may be communicatively coupled by cables. The cables may communicate data among the various components, transmit power among the various components, or the like.

Cables may become disconnected during shipment of the printer, after servicing, during normal operation, or the like. The printer may malfunction if a cable becomes disconnected. However, the disconnected cable may be difficult to diagnose and to distinguish from failures of hardware components. For example, a "communication lost" message on a control panel could mean that the formatter needs to be replaced, the control panel needs to be replaced, or that the cable simply needs to be plugged in. The disconnected cable may result in multiple service visits, unnecessary replacement of components, or the like. Accordingly, disconnected cables may result in increased service costs.

The printer may be able to detect whether internal cables are properly connected. However, the printer may use wall power received via a power supply to determine whether the internal cables are connected. Accordingly, the printer may be unable to detect whether the internal cables are connected if the printer is not connected to wall power, a power supply is malfunctioning, a power cable is disconnected, or the like. The printer would be improved if it could detect whether internal cables are properly connected without using wall power to detect whether cables are connected properly.

Figure 1:
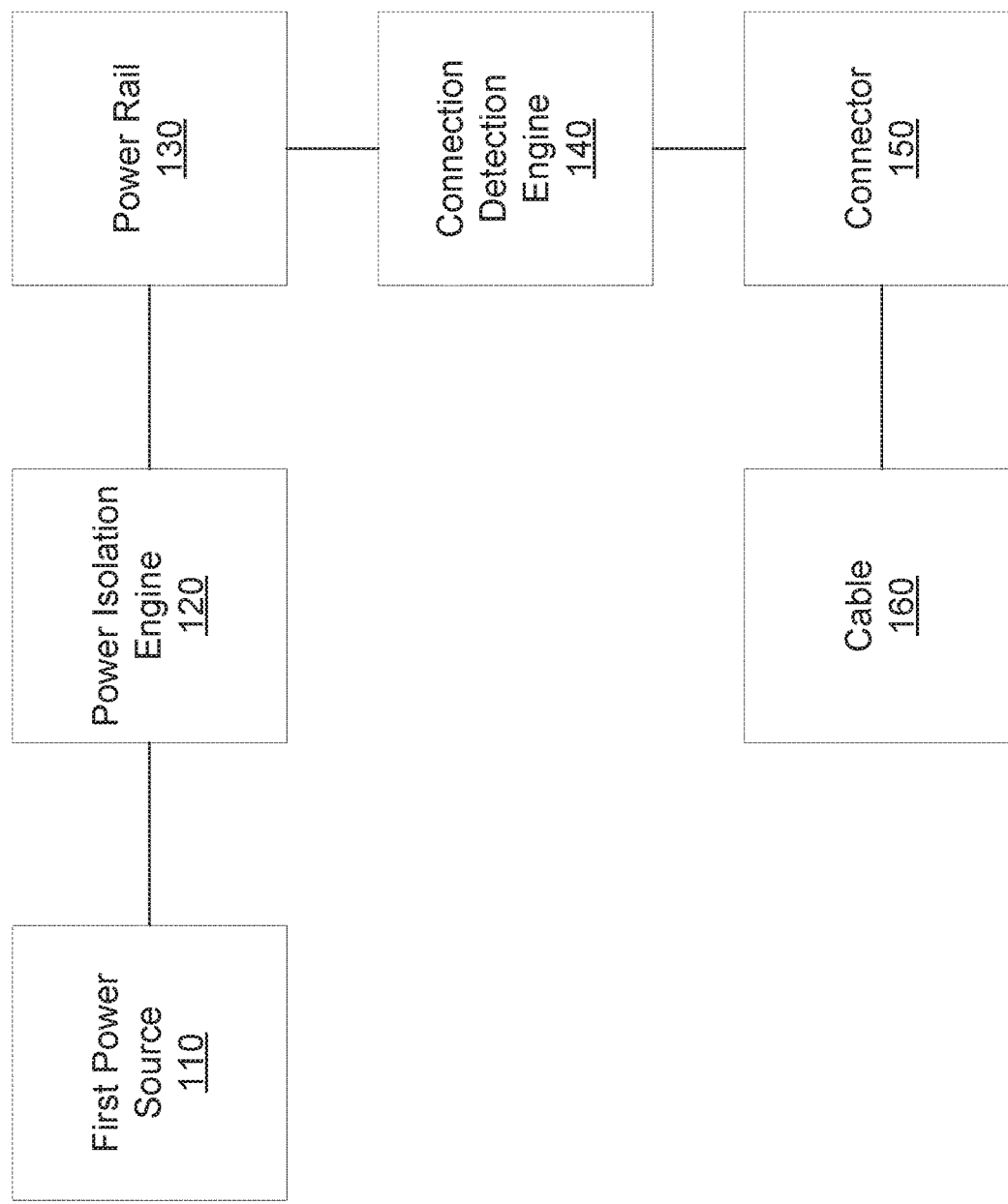
FIG. 1 is a block diagram of an example system to detect whether a cable is properly connected.

FIG. 1 is a block diagram of an example system 100 to detect whether a cable 160 is properly connected. The system 100 may include a connector 150 that is mateable with the cable 160. When properly connected, the cable 160 may mechanically engage with the connector 150 to connect a plurality of conductors in the cable 160 to a corresponding plurality of conductors in the connector 150. The connection may create a low impedance electrical path between the conductors of the connector 150 and the conductors of the cable 160.

The system 100 may include a connection detection engine 140. As used herein, the term "engine" refers to hardware (e.g., a processor, such as an integrated circuit, or analog or digital circuitry) or a combination of software (e.g., programming such as machine- or processor-executable instructions, commands, or code such as firmware, a device driver, programming, object code, etc.) and hardware. Hardware includes a hardware element with no software elements such as an application specific integrated circuit (ASIC), a Field Programmable Gate Array (FPGA), etc. A combination of hardware and software includes software hosted at hardware (e.g., a software module that is stored at a processor-readable memory such as random access memory (RAM), a hard-disk or solid-state drive, resistive memory, or optical media such as a digital versatile disc (DVD), and/or executed or interpreted by a processor), or hardware and software hosted at hardware. The connection detection engine 140 may detect whether the cable 160 is connected to the connector 150. For example, the connection detection engine 140 may detect whether there is a low impedance electrical path between conductors in the cable 160 and conductors in the connector 150.

The system 100 may include a first power source 110. The first power source 110 may provide power to the system 100. For example, the first power source 110 may provide power to the connection detection engine 140, which may use the provided power to detect whether the cable 160 is connected to the connector 150. The first power source 110 may also, or instead, provide power to the cable 160 or connector 150 to be used to detect whether the cable 160 is connected to the connector 150.

The system 100 may include a power rail 130 to electrically couple the connection detection engine 140 to a second power source (not shown). For example, when the power rail 130 receives power from the second power source, the power rail 130 may provide the power to the connection detection engine 140. In some examples, the power rail 130 may also provide power from the first power source 110 to the connection detection engine 140. Accordingly, the first power source 110 and the second power source may both provide power to the power rail 130.

The system 100 may include a power isolation engine 120 to prevent the second power source from providing power to the first power source 110 or a plurality of components electrically coupled to the first power source 110. In the illustrated example, the power isolation engine 120 may electrically couple the first power source 110 to the power rail 130. When the second power source is providing power to the power rail 130, the power isolation engine 120 may prevent that power from travelling to the first power source 110 or to other components electrically coupled to the first power source 110. Accordingly, the system 100 is able to detect whether internal cables are properly connected even if power is not being received from the first power source.

Figure 2:
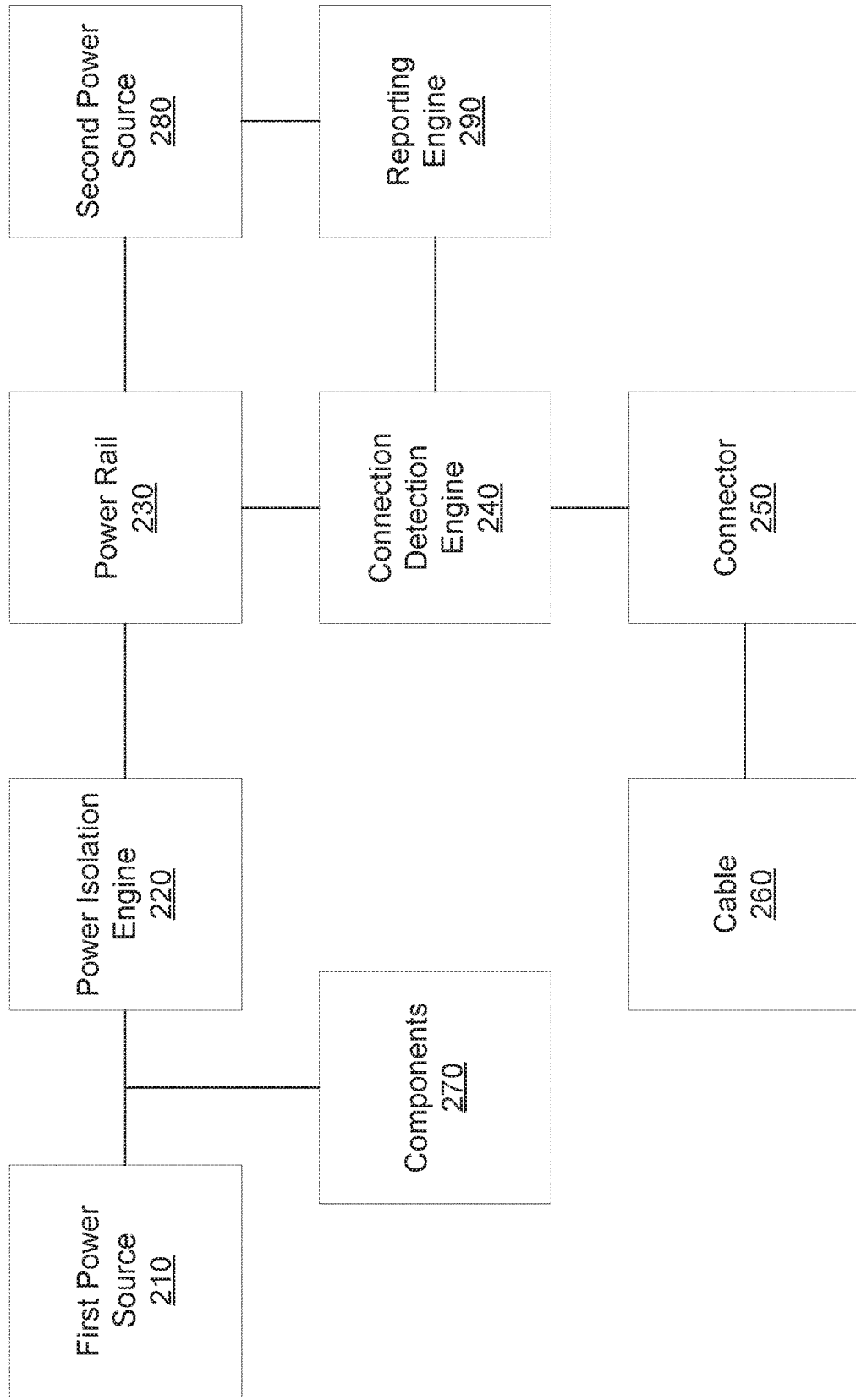
FIG. 2 is a block diagram of another example system to detect whether a cable is properly connected.

FIG. 2 is a block diagram of another example system 200 to detect whether a cable 260 is properly connected. The system 200 may include the cable 260 and a connector 250 that is mateable with the cable 260. The cable 260 may include a plurality of ends that mate with a plurality of connectors. Alternatively, or in addition, the cable 260 may be permanently attached at an end. A single end may be checked to see if it is properly connected, or any of a plurality of ends may be checked. The cable 260 or connector 250 may include electrical connections that allow the connection to be checked. For example, a conductor of the connector 250 may be electrically coupled to a high or low potential. The connector 250 may also, or instead, include a loopback that connects a plurality of conductors of the connector 250 electrically connected together. When the cable 260 is connected properly, a potential applied to one of the conductors of the cable 260 corresponding to one of the plurality of conductors connected together may be detected on other conductors of the cable 260 corresponding to other conductors in the plurality of conductors connected together.

The system 200 may include a connection detection engine 240. The connection detection engine 240 may detect whether the cable 260 is properly electrically connected to the connector 250. The connection detection engine 240 may detect whether the cable 260 is properly connected based on a static potential on a conductor in the cable 260. As used herein, the term "static" refers to a value that does not change over time or changes infrequently relative to the clock rate of digital circuitry. The connector 250 may transmit a high potential, low potential, loopback potential, or the like to the conductor in the cable 260 when the cable 260 is properly connected to the connector 250. The potential transmitted by the connector 250 may be a predetermined potential. The connection detection engine 240 may detect whether the potential of the conductor matches the predetermined potential, for example, by measuring the potential of the conductor. The connection detection engine 240 may determine whether the cable 260 is properly connected to the connector 250 based on whether the measured and predetermined potentials match. The connection detection engine 240 may also, or instead, apply a potential to another conductor, such as a conductor included in a loopback connection. In some examples, the connection detection engine 240 may determine whether a plurality of cables is properly connected to a plurality of connectors.

The connection detection engine 240 may receive power from a power rail 230. The power rail 230 may electrically couple the connection detection engine 240 to second power source 280. The power rail 230 may also electrically couple the connection detection engine 240 to a first power source 210. In an example, the first power source 210 may be a power supply, such as a power supply connected to wall power. The second power source 280 may be a battery, such as a low capacity battery (e.g., a battery with a capacity less than about 100 milliamphours (mAh), 200, mAh, 500 mAh, 1,000 mAh, 2,000 mAh, etc.), a battery in a mobile device, or the like. The system 200 may include the second power source 280, or the second power source 280 may be removably coupled mechanically or electrically to the system 200. The second power source 280 may be limited in energy capacity, maximum power output, or the like. Accordingly, the second power source 280 may not have sufficient energy, power, etc. to deliver power to the connection detection engine 240 as well as the first power source 210 and other components 270 electrically connected to the first power source 210. The first power source 210 may provide power when the first power source 210 is able to do so. The second power source 280 may provide power based on a voltage rail from the first power source being unpowered. For example, the second power source 280 may provide the power based on the system 200 not receiving power from the first power source 210.

The system 200 may include a power isolation engine 220 to prevent the second power source 280 from providing power to the first power source 210 or a plurality of components 270 electrically coupled to the first power source 210. The power isolation engine 220 may allow the first power source 210 to provide power to the power rail 230 and the connection detection engine 240 when the first power source 210 is providing power. The first power source 210 may also power the plurality of components 270 electrically coupled to the first power source 210 when the first power source 210 is providing power. The power isolation engine 220 may consume little power and produce at most a small drop in potential between the first power source 210 and the power rail 230 when the first power source 210 is providing power.

When the first power source is not providing power, the power isolation engine 220 may disconnect the first power source 210 and the plurality of components 270 electrically coupled to the first power source 210 from the power rail 230. Accordingly, the second power source 280 may apply a potential to the power rail 230, but the power isolation engine 220 may block the potential from driving current to the first power source 210 or the plurality of components 270 electrically coupled to the first power source 210. The power isolation engine 220 may allow second power source 280 with a smaller energy capacity to be used by preventing any loads that might overwhelm a smaller second power source from drawing power from the second power source 280.

The system 200 may include a reporting engine 290. Alternatively, or in addition, the system 200 may not include the reporting engine 290, which may be removably coupled to the system 200. For example, the second power source 280, the reporting engine 290, or the connection detection engine 240 may be an integrated unit that can be toollessly attached to or removed from the system 200. The integrated unit may plug into a port or a board in the system 200, connect with a cable to a port or a board in the system 200, or the like. In some examples, the second power source 280, the reporting engine 290, or the connection detection engine 240 may be permanently coupled to the system 200 or attached and removed with tools (e.g., via screws, bolts, etc.). In an example, the system 200 may include the reporting engine 290 and the connection detection engine 240 but not the second power source 280. A mobile device may include the second power source 280 and connect to the system 200. The mobile device may include the reporting engine 290 or communicatively couple to a reporting engine 290 in the system 200.

The reporting engine 290 may be communicatively coupled to the connection detection engine 240. The connection detection engine 240 may transmit an indication of whether the cable 260 is connected to the reporting engine 290, which may receive the indication. The reporting engine 290 may transmit the indication to a remote system. The reporting engine 290 may be directly or indirectly communicatively coupled to the remote system via a wire or a wireless connection. In an example, the remote system may be a mobile device. For example, a service technician may couple the mobile device to the system 200, and the mobile device may act as the second power source 280 to provide power via a wire or wirelessly to the connection detection engine 240. The reporting engine 290 may transmit the indication of whether the cable 260 is connected to the mobile device via a wire or wirelessly. The mobile device may indicate to the service technician whether the cable 260 is properly connected.

In an example, the reporting engine 290 may transmit the indication of whether the cable 260 is connected to a central server. In an example, the reporting engine 290 may transmit the indication of whether the cable 260 is connected to the central server over a network. The reporting engine 290 may be communicatively coupled to the network by a wire (e.g., an Ethernet cable or the like), by a wireless connection (e.g., a WiFi connection, a Bluetooth connection, a Bluetooth Low Energy (LE) connection, or the like. The reporting engine 290 may transmit the indication to another system, which may transmit the indication to the central server. The reporting engine 290 may transmit the indication to the other system using a low power wireless communication protocol, such as Bluetooth LE or the like. For example, the other system may be near the system 200, so the reporting engine 290 can transmit the indication to the other system without using a significant amount of power. In an example, the reporting engine 290 may transmit the indication if the cable 260 is disconnected but not if the cable 260 is connected to conserve the amount of energy used for communication. Accordingly, the system 200 may be able to detect and report whether an internal cable is detected even when not receiving wall power, and the system 200 may use little power and an inexpensive second power source to perform the detection and reporting. In some examples, the system 200 may draw less than about 10 milliwatts (mW), 20 mW, 40 mW, 80 mW, 100 mW, 150 mW, 200 mW, or the like from the second power source 280.

Figure 3:
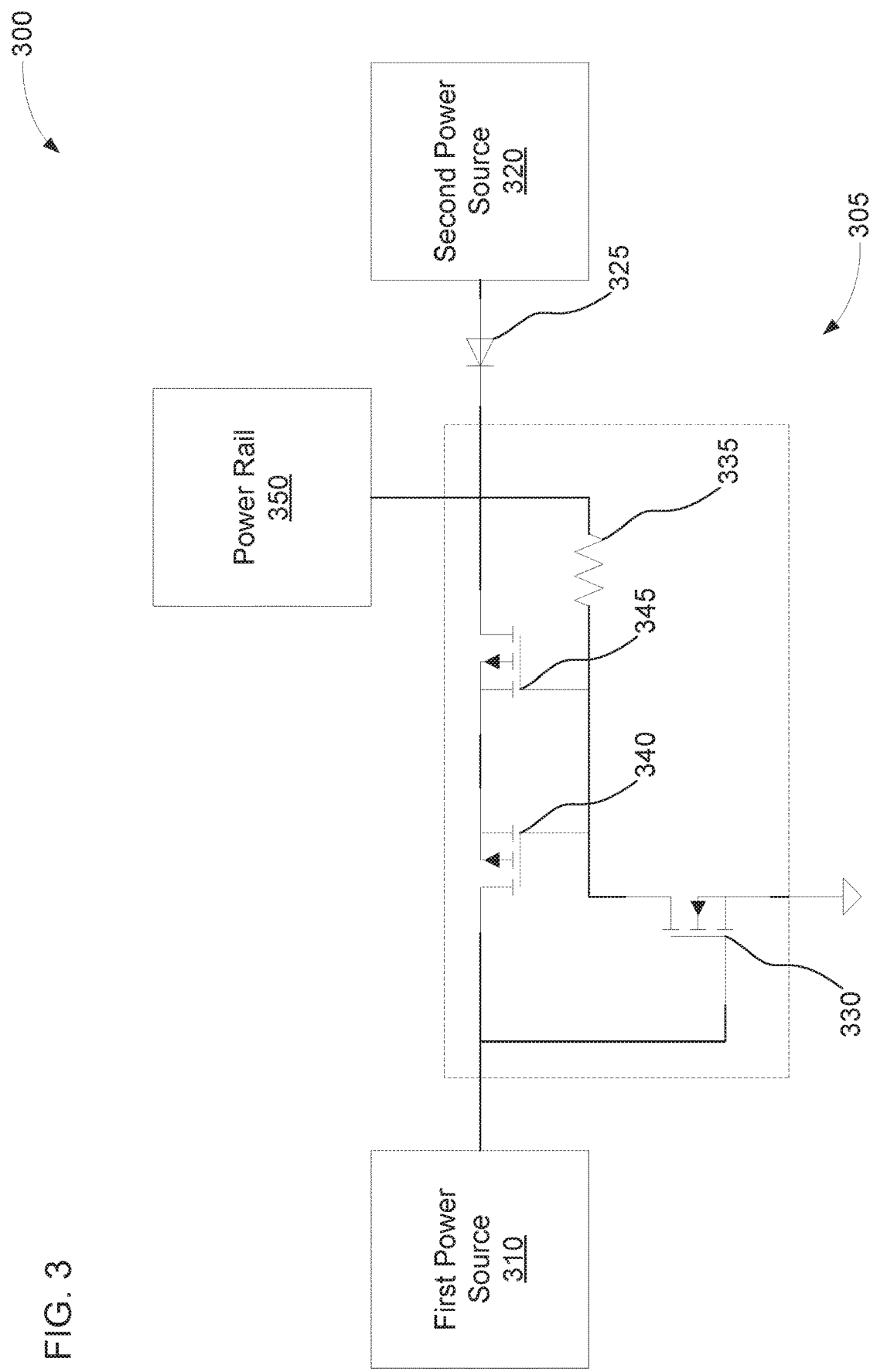
FIG. 3 is a schematic diagram of an example power isolation engine to prevent a second power source from providing power to a first power source.

FIG. 3 is a schematic diagram of an example power isolation engine 305 to prevent a second power source 320 from providing power to a first power source 310. An environment 300 may include the power isolation engine 305. In the illustrated example, the environment 300 may include a diode 325 directly connected to the second power source 320. The diode 325 may prevent the first power source 310 from providing power to the second power source 320, which might otherwise be damaged by the power. The diode 325 may also prevent the second power source 320 from providing power when the first power source 310 is providing power. The first and second power sources 310, 320 may output power at a same potential, and the diode 325 may create a potential drop between the second power source 320 and the power rail 350 when the second power source 320 is outputting power through the diode 325. When the first power source 310 has powered the power rail 350 to a potential equal to or greater than that of the second power source 320, the lack of a potential drop may prevent power from flowing through the diode 325. When the first power source 310 is not providing power, the second power source 320 may provide power to the voltage rail 350. In some examples, the environment 300 may include transistors to prevent the second power source 320 from providing power when the first power source 310 is providing power.

The power isolation engine 305 may detect whether a voltage rail from the first power source 310 is powered. For example, the power isolation engine 305 may detect whether the first power source 310 is providing power to the power isolation engine 305. The power isolation engine 305 may include a first transistor 330 to detect whether the voltage rail from the first power source 310 is powered. For example, a gate of the first transistor 330 may be directly connected to the power rail from the first power source 310. The drain of the first transistor 330 may be connected to the power rail 350 through a resistor 335, and the source may be tied to ground. When the first power source 310 is providing power, the first transistor 330 may connect the drain to the source producing a low potential at the drain. When the first power source 310 is not providing power, the first transistor 330 may isolate the source from the drain.

The power isolation engine 305 may include a plurality of transistors, such as a second transistor 340 and a third transistor 345, to isolate the first power source 310 from the power rail 350. The gates of the second and third transistors 340, 345 may be directly connected to the drain of the first transistor 330. Accordingly, the first transistor 330 may signal to second and third transistors 340, 345 whether there is power available on the voltage rail from the first power source 310. The drains of the second and third transistors 340, 345 may be connected directly to the first power source 310 and the power rail 350 respectively. The sources of the second and third transistors 340, 345 may be directly connected to each other. When there is a low potential at the gates of the second and third transistors 340, 345 (e.g., when the first transistor 330 signals power is available), the second and third transistors 340, 345 may allow the power to flow from the first power source 310 to the power rail 350. When there is a high potential at the gates of the second and third transistors 340, 345 (e.g., when the first transistor signals power is not available), the second and third transistors 340, 345 may block power from flowing from the second power source 320 to the first power source 310. In some examples, the first transistor 330 may be a P-type transistor rather than the illustrated N-type, or the second and third transistors 340, 345 may be N-type transistors rather the illustrated P-type, and the connections between the transistors 330, 340, 345 may be rearranged accordingly. The power isolation engine 305 may consume little power while still being able to selectively isolate the first power source 310 from the power rail 350.

Figure 4:
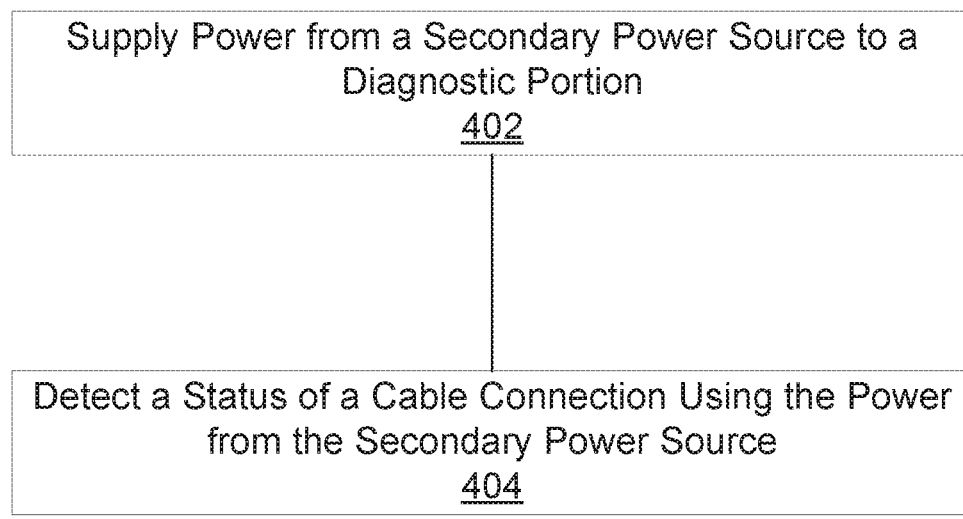
FIG. 4 is a flow diagram of an example method to detect whether a cable is properly connected.

FIG. 4 is a flow diagram of an example method 400 to detect whether a cable is properly connected. A processor may perform the method 400. At block 402, the method 400 may include supplying power from a secondary power source to a diagnostic portion of a system. The diagnostic portion of the system may draw a small amount of power. The power may be supplied based on the system receiving a lack of power from a primary power source. For example, if primary power source is disconnected or a failure occurs, the secondary power source may transmit power to the diagnostic portion. The diagnostic portion may draw much less power than the system as a whole, so the secondary power source may be undersized relative to the primary power source.

At block 404, the method 400 may include detecting a status of a cable connection internal to the system. The power from the secondary power source may be used to detect the status of the cable connection. The status may be whether the cable is properly connected. The detecting of the status may be based on a static potential on a conductor in a cable. For example, detecting the status may include determining whether a potential detected on a conductor in the cable matches a predetermined potential. Referring to FIG. 2, the second power source 280, for example, may supply the power, and the connection detection engine 240 may detect the status of the cable connection.

Figure 5:
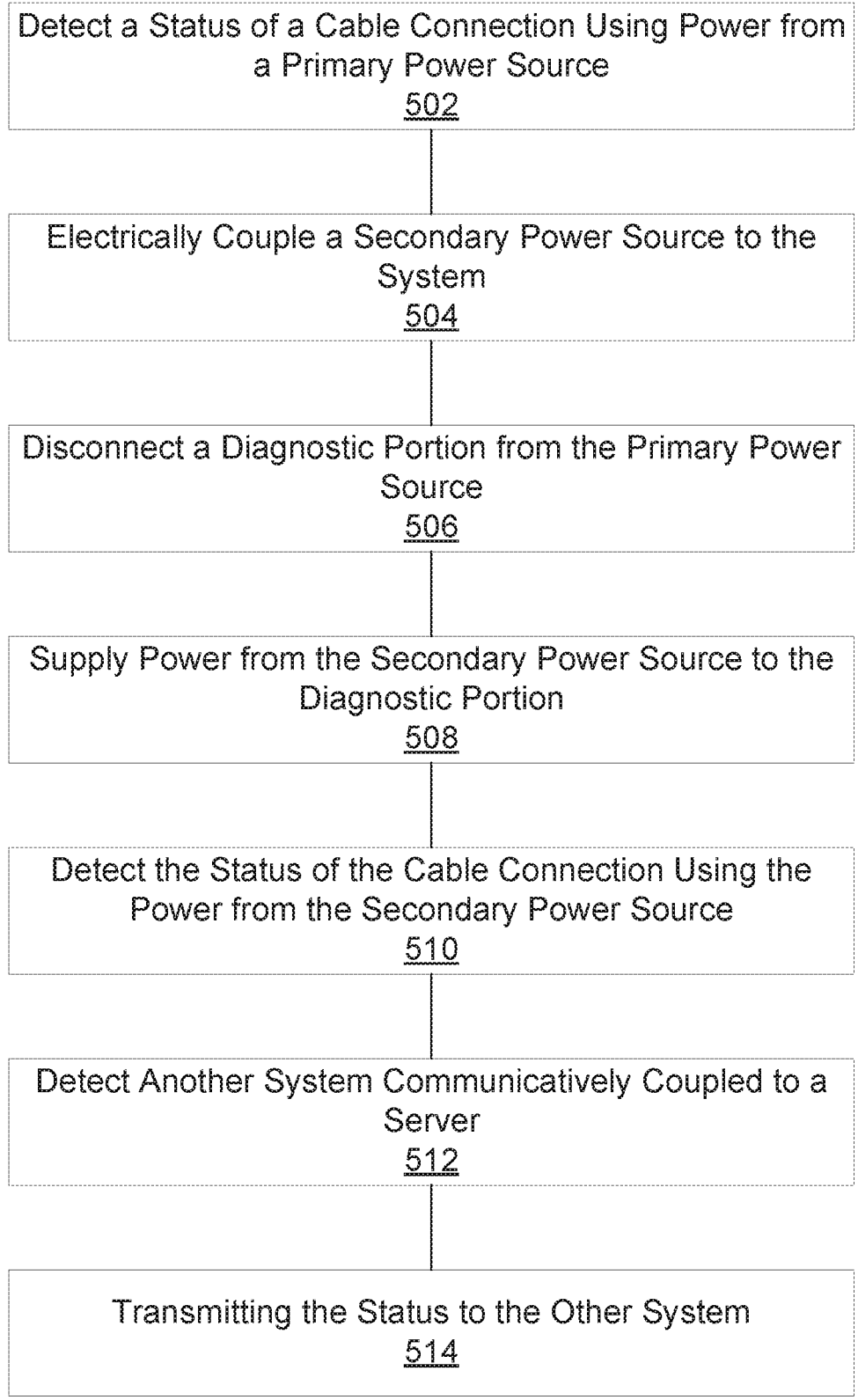
FIG. 5 is a flow diagram of another example method to detect whether a cable is properly connected.

FIG. 5 is a flow diagram of another example method 500 to detect whether a cable is properly connected. A processor may perform the method 500. At block 502, the method 500 may include detecting a status of a cable connection using power from a primary power source. The cable connection may be internal to a system. The primary power source may be operational and providing power to the system. For example, the primary power source may be connected to wall power. Detecting the status of the cable connection may include detecting a static potential on a conductor in the cable. The static potential may be created with the power from the primary power source. The power from the primary power source may also be used to measure the potential on the conductor and to evaluate whether the measured potential matches a predetermined value. The status of the cable connection may be determined based on whether the measured potential matches the predetermined value.

At block 504, the method 500 may include electrically coupling a secondary power source to the system. The secondary power source may be electrically coupled directly to an external interface, an internal conductor, or the like. The secondary power source may be included in a mobile computing device, in a custom device to be removably coupled to the system, or the like. Alternatively, or in addition, the secondary power source may include a battery, such as a low capacity battery, that may be inserted into the system. At block 506, the method 500 may include disconnecting a diagnostic portion of the system from the primary power source. For example, the diagnostic portion may be disconnected from the primary power source based on detecting that the primary power is not providing power to a voltage rail connecting the primary power source to the diagnostic portion. A switch, such as a transistor, may be turned off to disconnect the diagnostic portion from the primary power source. After disconnection, power may be unable to flow from the diagnostic portion to the primary power source.

At block 508, the method 500 may include supplying power from the secondary power source. In an example, the secondary power source may not supply power when the diagnostic portion is receiving power from the primary power source. When the primary power source is not providing power to the diagnostic portion, the secondary power source may provide power to the diagnostic portion. In an example, the secondary power source may provide power to the diagnostic portion and a portion of the system to report whether the cable is connected, but the secondary power source may not provide power to any other portions of the system. The diagnostic portion and the reporting portion may draw a small amount of power. For example, the secondary power source may supply less than about 10 mW, 20 mW, 40 mW, 80 mW, 100 mW, 150 mW, 200 mW, or the like.

At block 510, the method 500 may include detecting the status of the cable connection using the power from the secondary power source. The diagnostic portion may include conductors in the cable to be set to particular potentials, logic to measure the particular potentials, or the like. The diagnostic portion may use the power from the secondary power source to measure the potential of the conductor, compare the measured potential to a predetermined value, and determine based on the comparison whether the cable is connected. The diagnostic portion may use a small amount of power to perform the measuring, comparing, and determining.

At block 512, the method 500 may include detecting another system communicatively coupled to a server. For example, messages may be transmitted periodically or aperiodically to detect other systems. The messages may be transmitted wirelessly or over a wire. In an example, the messages may be transmitted using a low power wireless protocol and may detect other systems that are nearby. The detected systems may be communicatively coupled to a server. For example, the detected systems may be communicatively coupled to a network to which the server is also connected. In some examples, the system may be communicatively coupled directly to the network. Detecting the other system may include initiating a communicative coupling with the other system. The other system may be similar to the system containing the cable (e.g., both may be printers). Alternatively, or in addition, the other system may be a different type of system, such as office infrastructure (e.g., a wireless access point, a computer, etc.), consumer devices (e.g., a television, an appliance, etc.), a mobile computing device, or the like.

At block 514, the method 500 may include transmitting the status of the cable connection to the other system. For example, the status may be transmitted over a wired or wireless connection, such as a low power wireless communication protocol. The other system may transmit the status to the server. Accordingly, a service technician may be able to access the server in advance of a trip to service the printer to determine whether the problem is a loose cable or if additional replacement parts may be needed. In some examples, the status may be transmitted based on a determination that the cable is disconnected, and the status may not be transmitted based on a determination that the cable is connected. Limiting transmissions to when the cable is disconnected may further save power. The method 500 may allow a small secondary power source to enable detection of whether a cable in a system is connected regardless of whether the system is receiving power, the primary power source is functioning properly, or power cables are properly connected. The method 500 may also allow the status of the cable connection to be reported to external systems regardless of the state of the primary power source. In an example, blocks 502 and 510 may be performed by the connection detection engine 240 of FIG. 2; blocks 504 and 508 may be performed by the second power source 280 or the power rail 230; block 506 may be performed by the power isolation engine 220; and blocks 512 and 514 may be performed by the reporting engine 290.

Figure 6:
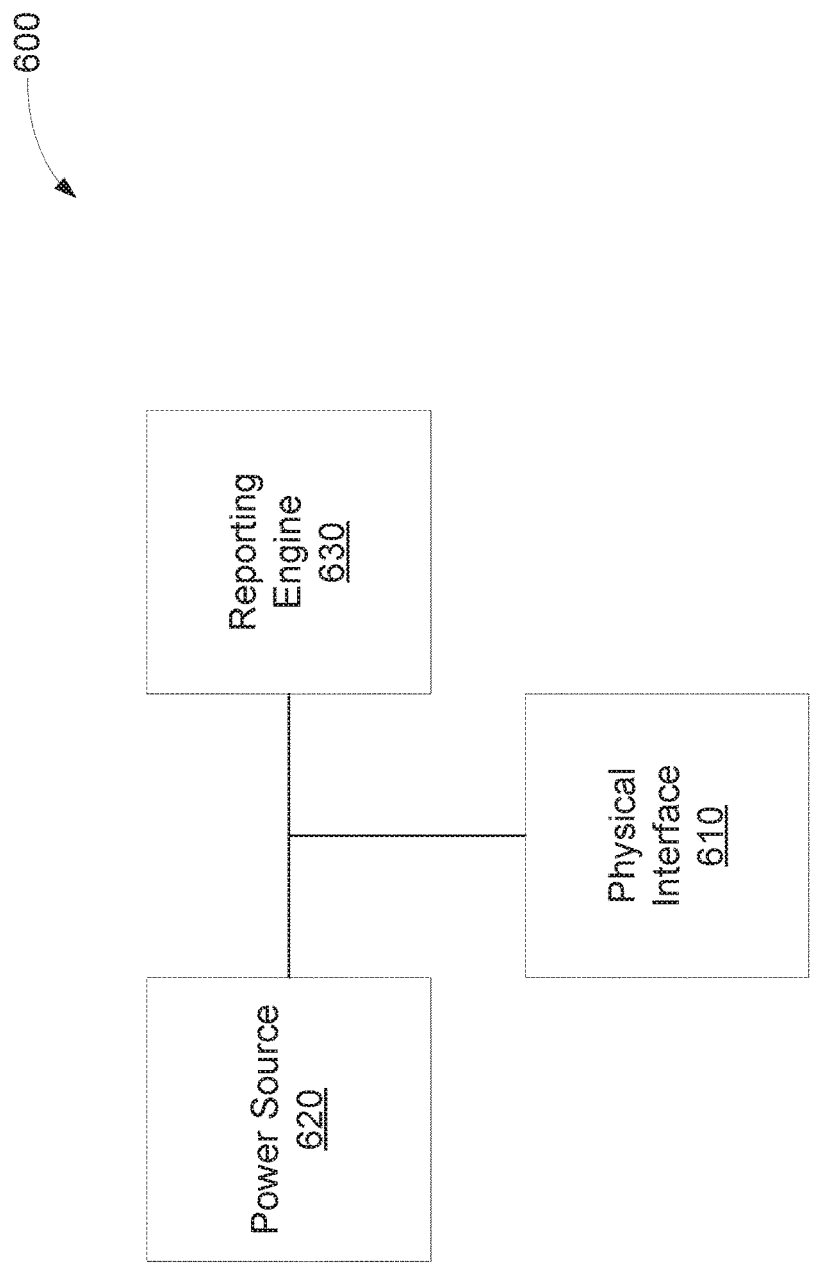
FIG. 6 is a block diagram of an example device to determine whether a cable of a system is connected properly.

FIG. 6 is a block diagram of an example device 600 to determine whether a cable of a system (not shown) is connected properly. The device 600 may include a physical interface 610 to connect to the system. As used herein, the term "physical interface" refers to hardware or hardware and software to implement a physical layer of a communication protocol or to conductors. The physical interface may mechanically or electrically connect to the system or connect via a protocol for wirelessly transmitting data or power.

The device 600 may include a power source 620 electrically coupled to the physical interface 610. The power source 620 may deliver power to a diagnostic portion of the system. For example, the physical interface 610 may couple the power source 620 to the system to enable delivery of power. The diagnostic portion of the system may draw a small amount of power. The power source 620 may deliver the power based on the system not receiving power from an internal source. For example, the power source 620 may deliver power when the internal power source is not delivering power, and the power source 620 may not deliver power when the internal power source is delivering power.

The device 600 may include a reporting engine 630. The reporting engine 630 may communicatively couple to the system. For example, the physical interface 610 may communicatively couple the reporting engine 630 to the system.

The reporting engine 630 may retrieve an indication of whether a cable in the system is connected. The system may include an internal engine to determine whether the cable is connected, and the reporting engine 630 may retrieve the indication from the internal engine. In an example, the physical interface 610 may connect the device 600 to the system 100 of FIG. 1.

Figure 7:
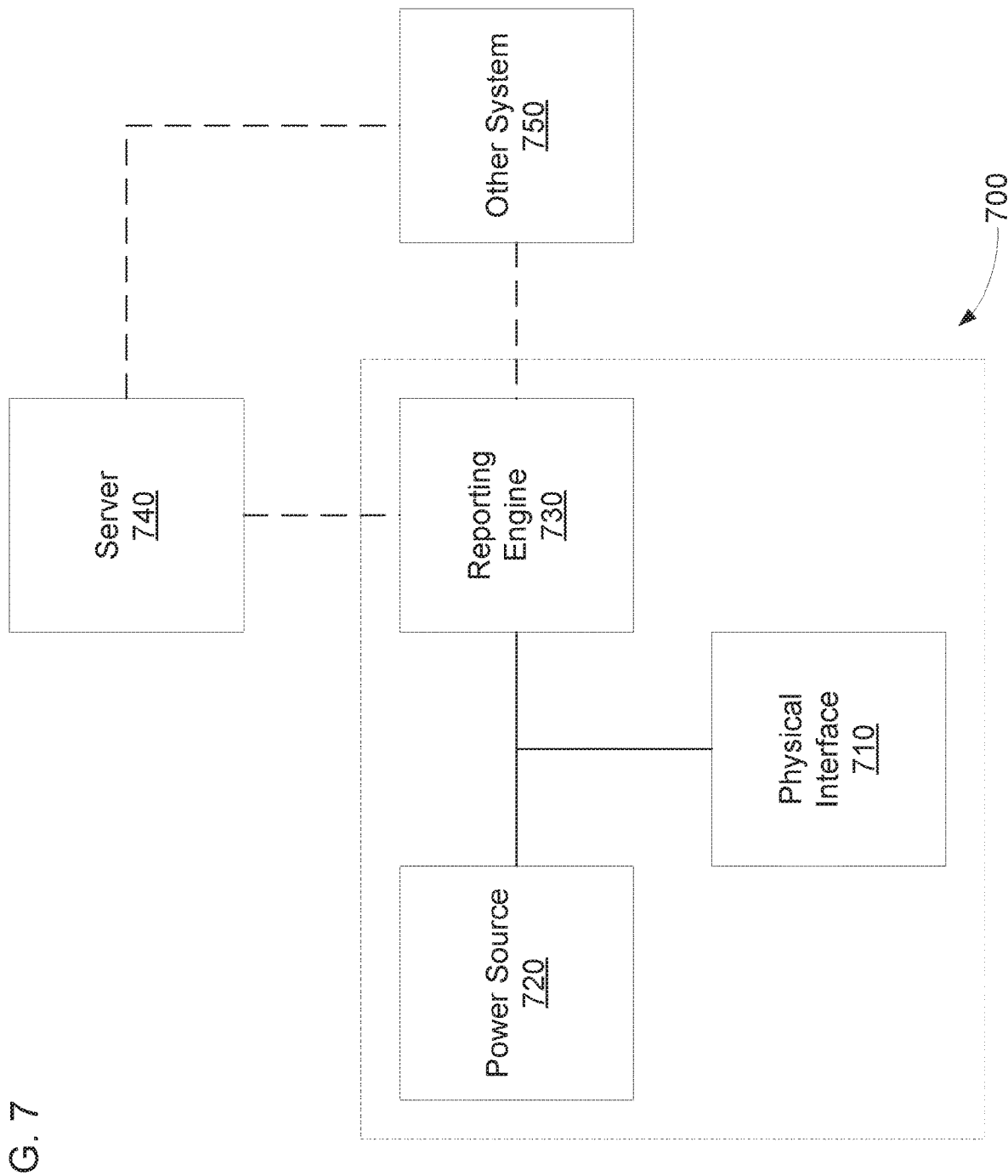
FIG. 7 is a block diagram of another example device to determine whether a cable of a system is connected properly.

FIG. 7 is a block diagram of another example device 700 to determine whether a cable of a system is connected properly. The system may include the device 700, which may be affixed to the system using tools. Alternatively, or in addition, the device may be removably coupled to the system, for example, via an internal connection, an external port, or the like. In some examples, the system may not include the device 700.

The device 700 may include a physical interface 710 to connect to the system. The physical interface 710 may be distinct from the cable of the system. The physical interface 710 may couple a power source 720 and a reporting engine 730 to the system. For example, the physical interface 710 may transmit power from the power source 720 to the system and communicate data between the reporting engine 730 and the system. The physical interface 710 may include a single connection or wireless protocol for carrying data and power or may include a connection or wireless protocol for data that is distinct from a connection of wireless protocol for power.

The power source 720 may deliver power to a diagnostic portion of the system via the physical interface 710. The physical interface 710 may electrically couple the power source 720 to a power rail that provides power to the diagnostic portion. The diagnostic portion may draw a small amount of power, and the power rail may be isolated from the rest of the system when the power source 720 is providing power. Accordingly, the power source 720 may deliver power to the diagnostic portion, and the diagnostic portion may be isolated from sharing the delivered power with other portions of the system. The power source 720 may deliver the power based on the system not receiving power from an internal source. The power source 720 or the physical interface 710 may detect whether the internal source is providing power, for example, using a diode, and the power source 720 or the physical interface may allow power to be provided based on the internal source not providing power. Alternatively, or in addition, the system may prevent the power source 720 from providing power unless the internal source is not providing power. The second power source 720 may be a battery. For example, the second power source 720 may be a battery that stores a small amount of energy (e.g., a button cell, a battery of a mobile computing device, etc.).

The reporting engine 730 may be communicatively coupled to the system. For example, the reporting engine 730 may be communicatively coupled to a connection detection engine that determines whether an internal cable in the system is connected. Alternatively, or in addition, the device 700 may include the connection detection engine, which may communicatively couple to the cable via the physical interface 710. The reporting engine 730 may request an indication of whether the internal cable is connected and receive a response including the indication. In an example, the reporting engine 730 may transmit to a central server 740 the indication of whether the internal cable is connected. In some examples, the reporting engine 730 may transmit the indication if the cable is unconnected but not if the cable is connected. Accordingly, the reporting engine 730 may determine whether the cable is connected before transmitting the indication. The reporting engine 730 may connect directly to a network able to communicate messages from the reporting engine 730 to the central server 740 and may transmit the indication to the central server 740 over the network.

In some examples, the reporting engine 730 may transmit to another system 750 the indication of whether the internal cable is connected. For example, the other system 750 may be communicatively coupled directly to the network, but the reporting engine 730 may not be communicatively coupled directly to the network. The reporting engine 730 may transmit the indication to the other system 750, and the other system 750 may transmit the indication to the central server 740. Alternatively, or in addition, the other system 750 may be a final destination to which the reporting engine 730 transmits the indication. The reporting engine 730 may transmit the indication to the remote system using a low power wireless protocol, such as Bluetooth LE or the like. The physical interface 710 may connect the power source 720 to the power rail 130 of FIG. 1, for example, and the reporting engine 730 to the connection detection engine 140, for example.

The above description is illustrative of various principles and implementations of the present disclosure. Numerous variations and modifications will become apparent to those skilled in the art once the above disclosure is fully appreciated. Accordingly, the scope of the present application should be determined only by the following claims.

What is claimed is:

1. A system comprising:
   a cable to connect to a connector;
   a connection detection engine to detect whether the cable is connected to the connector;
   a first power source to power the system, including the connection detection engine;
   a power rail to electrically couple the connection detection engine to a second power source, wherein the second power source is to power the connection detection engine when a voltage rail from the first power source is unpowered and wherein the connection detection engine is to detect whether the cable is connected to the connector based on a static potential on a conductor in the cable; and
   a power isolation engine to prevent the second power source from providing power to the first power source and a plurality of components electrically coupled to the first power source.

2. The system of claim 1, further comprising a reporting engine communicatively coupled to the connection detection engine, the reporting engine to receive an indication of whether the cable is connected, and transmit the indication to a remote system.

3. The system of claim 2, wherein the second power source is to power the connection detection engine and the reporting engine, and wherein the power isolation engine is to prevent the second power source from providing power to components besides the connection detection engine and the reporting engine.

4. The system of claim 1, wherein the second power source is removably coupleable to the power rail.

5. A method, comprising:
   supplying power from a secondary power source to a diagnostic portion of a system, the diagnostic portion drawing a small amount of power, wherein supplying the power comprises supplying the power based on the system receiving a lack of power from a primary power source; and detecting, using the power from the secondary power source, a status of a cable connection internal to the system, the detecting based on a static potential on a conductor in the cable.

6. The method of claim 5, further comprising, prior to supplying the power from the secondary power source, detecting, using power supplied from the primary power source, the status of the cable connection.

7. The method of claim 5, further comprising disconnecting the diagnostic portion from the primary power source based on a voltage rail from the primary power source being unpowered.

8. The method of claim 5, further comprising detecting another system communicatively coupled to a server and wirelessly transmitting the status to the other system for transmission to the server.

9. The method of claim 5, further comprising, prior to supplying the power from the secondary power source, electrically coupling the secondary power source to the system.

10. A device comprising:
a physical interface to connect to a system;
a power source to deliver power to a diagnostic portion of the system via the physical interface, the diagnostic portion drawing a small amount of power, the power source to deliver the power based on the system not receiving power from an internal source; and
a reporting engine to communicatively couple to the system via the physical interface, the reporting engine to retrieve an indication from the diagnostic portion of whether a cable in the system is connected based on a static potential on a conductor in the cable.

11. The device of claim 10, wherein the reporting engine is to transmit to a central server an indication the cable is unconnected based on determining the cable is unconnected.

12. The device of claim 10, wherein the reporting engine is to transmit to a remote system the indication of whether the cable is connected, and wherein the reporting engine is to transmit the indication to the remote system using a low power wireless protocol.

13. The device of claim 10, wherein the system comprises the device, and wherein the diagnostic portion of the system is isolated from sharing the delivered power with another portion of the system.

14. The device of claim 10, wherein the power source comprises a battery.

* * * * *